(12) United States Patent
Manabe et al.

(10) Patent No.: US 8,188,547 B2
(45) Date of Patent: May 29, 2012

(54) SEMICONDUCTOR DEVICE WITH COMPLEMENTARY TRANSISTORS THAT INCLUDE HAFNIUM-CONTAINING GATE INSULATORS AND METAL GATE ELECTRODES

(75) Inventors: Kenzo Manabe, Kanagawa (JP); Toshihiro Iizuka, Kanagawa (JP); Daisuke Ikeno, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 166 days.

(21) Appl. No.: 12/819,662

(22) Filed: Jun. 21, 2010

(65) Prior Publication Data
US 2010/0327366 A1 Dec. 30, 2010

(30) Foreign Application Priority Data

Jun. 26, 2009 (JP) .................. 2009-152510

(51) Int. Cl.
*H01L 29/78* (2006.01)
(52) U.S. Cl. ........ 257/369; 257/406; 257/411; 257/412; 257/E29.165
(58) Field of Classification Search .................. 257/405, 257/406, E29.132
See application file for complete search history.

(56) References Cited

U.S. PATENT DOCUMENTS

| | | | |
|---|---|---|---|
| 2007/0176242 A1* | 8/2007 | Lee et al. | 257/369 |
| 2007/0212896 A1* | 9/2007 | Olsen et al. | 438/758 |
| 2008/0128822 A1* | 6/2008 | Koyama et al. | 257/369 |
| 2008/0303099 A1* | 12/2008 | Iwamoto et al. | 257/369 |
| 2010/0176456 A1* | 7/2010 | Ikeno et al. | 257/369 |
| 2011/0227171 A1* | 9/2011 | Chudzik et al. | 257/411 |

FOREIGN PATENT DOCUMENTS

JP 2006-108602 4/2006

OTHER PUBLICATIONS

Narayaanan et al., "Band-Edge high-Performance High-k/Metal Gate n-MOSFETs using Cap Layers Containing Group IIA and IIIB", Elements with Gate-First Processing for 45 nm and Beyond, 2006 Symposium on VLSI Technology Digest of Technical Papers, Oct. 2006.

* cited by examiner

*Primary Examiner* — Stephen W Smoot
(74) *Attorney, Agent, or Firm* — Young & Thompson

(57) ABSTRACT

A first adjusting metal, capable of varying the threshold voltage of a first-conductivity-type transistor of a complementary transistor, is added to the first-conductivity-type transistor and a second-conductivity-type transistor at the same time, and a diffusion suppressive element, capable of suppressing diffusion of the first adjusting metal, is added from above a metal gate electrode of the second-conductivity-type transistor.

18 Claims, 12 Drawing Sheets

N channel (105)   P channel (104)

N channel (105)   P channel (104)

N channel (105)   P channel (104)

N channel (105)  P channel (104)

N channel (105)  P channel (104)

N channel(105)    P channel(104)

N channel(105)    P channel(104)

N channel (105)   P channel (104)

N channel (105)   P channel (104)

N channel (105)　　　　P channel (104)

N channel (105)　　　　P channel (104)

SEMICONDUCTOR DEVICE WITH COMPLEMENTARY TRANSISTORS THAT INCLUDE HAFNIUM-CONTAINING GATE INSULATORS AND METAL GATE ELECTRODES

This application is based on Japanese patent application No. 2009-152510, the content of which is incorporated hereinto by reference.

BACKGROUND

1. Technical Field

The present invention relates to a semiconductor device, and in particular to a semiconductor device which contains a complementary transistor having a stacked gate structure composed of a high-k gate insulating film and a metal gate electrode.

2. Background Art

Degradation in driving current due to depletion of polysilicon (poly-Si) electrode has been noticed as a growing problem, in development of complementary MOS (CMOS) device with the progress of shrinkage of constitutive transistors. Techniques for preventing degradation of the driving current has therefore been investigated, by adopting a metal gate electrode so as to avoid depletion of the electrode. Pure metal, metal nitride, silicides and so forth have been investigated as materials for composing the metal gate electrode. It is necessary for all cases that the threshold voltages ($V_{th}$) of both of N-type MOSFET and P-type MOSFET are adjustable to appropriate values.

For example, advanced CMOS transistors need $V_{th}$ adjusted to ±0.1 V or around. It is therefore necessary to adopt a material having an effective work function (EWF) close to that of N-type polysilicon (4.0 eV) for the gate electrode of N-type MOSFET, and to adopt a material having EWF close to that of P-type polysilicon (5.2 eV) or around for the gate electrode of P-type MOSFET.

At present, titanium nitride (TiN) have widely been discussed as a candidate material for the metal gate electrode, from the viewpoints of its excellent thermal stability and readiness in patterning into gate electrode. TiN is, however, known to have EWF at around a mid-gap level of silicon over a high-k gate insulating film, so that it is impossible to achieve a necessary level of low $V_{th}$ typically required for the N-type MOSFET, solely by this technique.

V. Narayanan et al. describe an N-type MOSFET having a $SiO_2$ film, a high-k gate insulating film and a TiN electrode formed in this order over a substrate, and further having a lanthanum oxide film selectively introduced as a cap film between the high-k gate insulating film and the TiN electrode, so as to shift the flat-band voltage ($V_{FB}$) towards the negative bias side, to thereby reduce EWF, and to consequently lower $V_{th}$ ("Band-Edge High-Performance High-k/Metal Gate n-MOSFETs using Cap Layers Containing Group IIA and IIIB Elements with Gate-First Processing for 45 nm and Beyond", 2006 Symposium on VLSI Technology Digest of Technical Papers, pp. 224-225).

The authors also describe that the shift of $V_{FB}$ towards the negative bias side increases as the thickness of the lanthanum oxide film increases, and thereby EWF may be lowered closed to the conduction band of Si, and a desired level of $V_{th}$ may be obtained. In short, lanthanum functions as an adjusting metal capable of varying the threshold voltage of the N-type MOSFET.

Japanese Laid-Open Patent Publication No. 2006-108602 describes a semiconductor device having a p-well layer and an n-well layer formed in the surficial portion of a silicon substrate, and an n-channel MISFET and a p-channel MISFET respectively formed in the well layers while being partitioned by a device isolation region. The n-channel MISFET has a non-nitrogen-added n-channel interfacial layer; non-nitrogen-added n-channel high-k gate insulating film; and an n-channel gate electrode formed therein. Also n-type source/drain diffusion layers are provided. Whereas, the p-channel MISFET has a nitrogen-added p-channel interfacial layer; a nitrogen-added p-channel high-k gate insulating film; and a nitrogen-added p-channel gate electrode formed therein. Also p-type source/drain diffusion layers are provided.

According to the publication, thus-configured semiconductor device, having nitrogen contained in the gate insulating film composed of the high-k film and in the metal gate electrode, successfully forms a high-performance complementary MISFET having an improved hole mobility in the p-channel MISFET, without degrading electron mobility in the n-channel MISFET.

However, the present inventors have found the following problems. The technique proposed by V. Narayanan et al., making an effort of lowering $V_{th}$ of the N-type MOSFET in the CMOS, by selectively introducing an adjusting metal such as lanthanum only into the N-type MOSFET, however, suffers from a problem as described below. In the CMOS, the adjusting metal such as lanthanum may selectively be formed only in the N-type MOSFET, by forming a lanthanum oxide film over the high-k gate insulating film of both the N-type MOSFET and the P-type MOSFET, then by forming a resist film which covers only the region having the N-type MOSFET formed therein, and by selectively removing the lanthanum oxide film in the P-type MOSFET. While the lanthanum oxide film herein might be removed typically by wet etching, also the high-k gate insulating film may adversely be affected by the etching solution in the process of removal of the lanthanum oxide film, enough to vary the thickness thereof. It is also anticipated that the lanthanum oxide film may partially remain in the P-type MOSFET. Since the above-described events may vary the thickness of the gate insulating film, so that $V_{th}$ and gate inversion dielectric thickness ($T_{inv}$) of the transistor may vary, and thereby the CMOS may no longer achieve desired performances or may cause variation in the performances.

SUMMARY

According to the present invention, there is provided a semiconductor device which includes:
a substrate;
a first-conductivity-type transistor having:
 an interfacial layer composed of a silicon oxide film or a silicon oxynitride film formed over the substrate;
 a high-k gate insulating film containing Hf and formed over the interfacial layer; and
 a metal gate electrode formed over the high-k gate insulating film,
and
a second-conductivity-type transistor having:
 an interfacial layer composed of a silicon oxide film or a silicon oxynitride film formed over the substrate;
 a high-k gate insulating film containing Hf and formed over the interfacial layer; and
 a metal gate electrode formed over the gate insulating film;
 a first adjusting metal for varying the threshold voltage of the first-conductivity-type transistor residing at the interface between the interfacial layer and the high-k gate insulating film, at least in the first-conductivity-type transistor, a diffusion suppressive element capable of suppressing diffusion of the first adjusting metal residing in the high-k gate insulating film, at least in the second-conductivity-type transistor, and the concentration of the diffusion suppressive element in the high-k gate insulating film of the second-conductivity-type transistor is higher than the concentration of the diffusion suppressive element in the high-k gate insulating film of the first-conductivity-type transistor.

According to these configurations, the threshold voltage of the first transistor may be varied by the first adjusting metal, by allowing the first adjusting metal to diffuse at the interface between the high-k gate insulating film and the interfacial layer. On the other hand, in the second transistor, the first adjusting metal is prevented from diffusing at the interface between the high-k gate insulating film and the interfacial layer, and thereby $V_{th}$ may be suppressed from being modulated by the first adjusting metal.

As a consequence, according to the present invention, $V_{th}$ may differently be adjustable for the N-type and P-type transistors by a simple process without needing selective formation of the first adjusting metal, and thereby the process of manufacturing may be simplified. According to these configurations, variation in $V_{th}$ and $T_{inv}$, ascribable to variation in the thickness of the gate insulating film may be avoidable, since the N-type and P-type transistors may be formed without adversely affecting the gate insulating film.

Note that all arbitrary combinations of the above-described constituents, and all exchanges of expression of the present invention made among method, device and so forth are valid as embodiments of the present invention.

According to the present invention, the threshold voltage of complementary transistor, having a stacked structure composed of a high-k gate insulating film and a metal gate electrode, may be adjustable by a simple procedure.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
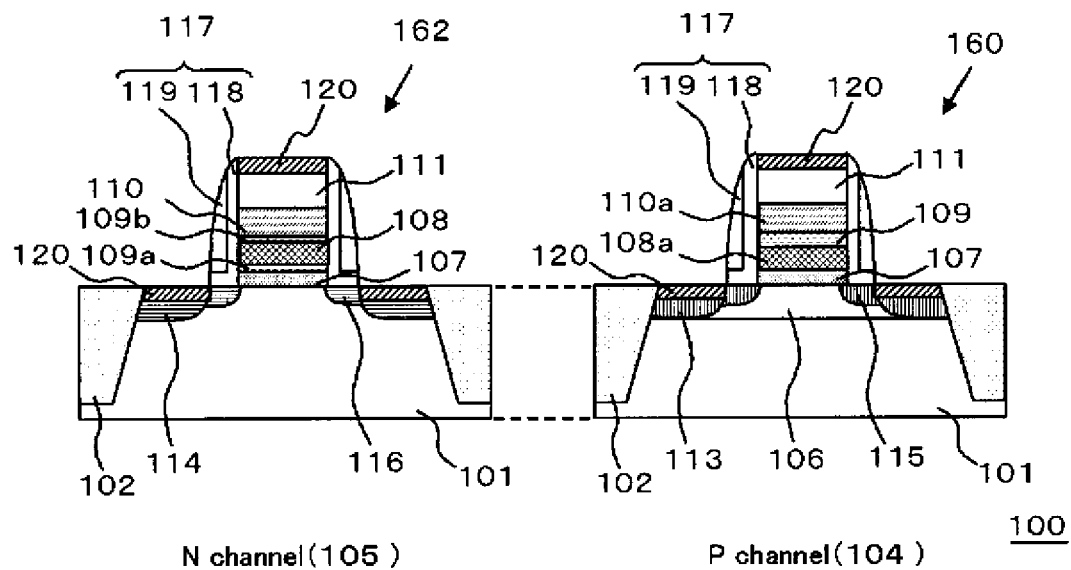
FIG. 1 is a sectional view illustrating a configuration of a semiconductor device in one embodiment of the present invention.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained, referring to the attached drawings. Note that all similar constituents in all drawings will be given similar reference numerals or symbols, and relevant explanation will not always necessarily be repeated.

In this embodiment, the semiconductor device includes a substrate; a first-conductivity-type transistor having an interfacial layer composed of a silicon oxide film or a silicon oxynitride film formed over the substrate, a high-k gate insulating film containing Hf and formed over the interfacial layer, and a metal gate electrode formed over the high-k gate insulating film; and a second-conductivity-type transistor having an interfacial layer composed of a silicon oxide film or a silicon oxynitride film formed over the substrate, a high-k gate insulating film containing Hf and formed over the interfacial layer, and a metal gate electrode formed over the gate insulating film. In this semiconductor device, a first adjusting metal for varying the threshold voltage of the first-conductivity-type transistor resides at the interface between the interfacial layer and the high-k gate insulating film, at least in the first-conductivity-type transistor; a diffusion suppressive element capable of suppressing diffusion of the first adjusting metal resides in the high-k gate insulating film, at least in the second-conductivity-type transistor; and the concentration of the diffusion suppressive element in the high-k gate insulating film of the second-conductivity-type transistor is higher than the concentration of the diffusion suppressive element in the high-k gate insulating film of the first-conductivity-type transistor. The first adjusting metal is capable of reducing the work function of the first-conductivity-type transistor, and thereby capable of lowering the threshold voltage of the first-conductivity-type transistor. The first-conductivity-type transistor and the second-conductivity-type transistor are MISFET or MOSFET. In this embodiment, the concentration may be expressed by atomic concentration.

(First Embodiment)

In this embodiment, the first conductivity type may represent N-type, and the second conductivity type may represent P-type.

FIG. 1 is a sectional view illustrating a configuration of a semiconductor device of this embodiment. The cross section herein is taken in the direction of channel length of the transistor.

The semiconductor device 100 includes a substrate 101, a device isolation region 102 formed in the surficial portion of the substrate 101, a P-type channel region 104 (denoted as "P channel" in the drawing) and an N-type channel region 105 (denoted as "N channel" in the drawing) partitioned by the device isolation region 102, and a P-type transistor 160 (MISFET) and an N-type transistor 162 (MISFET) respectively formed in the P-type channel region 104 and the N-type channel region 105 of the substrate 101. The substrate 101 may be configured by, for example, a semiconductor substrate such as silicon substrate, or a silicon substrate having a semiconductor layer such as a SiGe layer formed thereon. In this embodiment, a channel SiGe layer 106 is formed in the surficial portion of the substrate 101 in the P-type channel region 104.

The P-type transistor 160 has an interfacial layer 107 formed over the substrate 101, a high-k gate insulating film 108a containing Hf and formed over the interfacial layer 107, and a TiN film 110a, which is a metal gate electrode, formed over the high-k gate insulating film 108a. The P-type transistor 160 further has a Si film 111 formed over the TiN film 110a, a silicide layer 120 formed over the Si film 111, side wall spacers 117 formed on the side faces of the gate electrode, P-type source/drain diffusion layers 113 and P-type extension diffusion layers 115 formed in surficial portions of the substrate 101, and silicide layers 120 formed in surficial portions of the P-type source/drain diffusion layers 113. The side wall spacers 117 may be configured by a silicon oxide film 118 and a silicon nitride film 119.

The N-type transistor 162 has the interfacial layer 107 formed over the substrate 101, the high-k gate insulating film 108 containing Hf and formed over the interfacial layer 107, and the TiN film 110, which is a metal gate electrode, formed over the high-k gate insulating film 108. The N-type transistor 162 further has the Si film 111 formed over the TiN film 110, the silicide layer 120 formed over the Si film 111, side wall spacers 117 formed on the side faces of the gate electrode, N-type source/drain diffusion layers 114 and N-type extension diffusion layers 116 formed in surficial portions of the substrate 101, and silicide layer 120 formed in surficial portions of the N-type source/drain diffusion layer 114.

In this embodiment, the interfacial layer 107 may be configured by a silicon oxide film or a silicon oxynitride film. The high-k gate insulating film 108 and the high-k gate insulating film 108a may be configured by HfSiO or HfSiON. Although HfSiO or HfSiON are exemplified in this embodiment, the high-k gate insulating film 108 and the high-k gate insulating film 108a may be any high-k insulating film including Hf.

In the N-type transistor 162, a first adjusting metal, capable of varying the threshold voltage of the N-type transistor, resides at the interface between the interfacial layer 107 and the high-k gate insulating film 108. In this embodiment, the first adjusting metal may be an element capable of reducing the work function of the N-type transistor, and of lowering the threshold voltage. In this embodiment, the first adjusting metal may be any one of La, Y, and Mg. The first adjusting metal may also be an element capable of suppressing nitrogen, described later as a diffusion suppressive element, from diffusing into the interfacial layer 107. From this point of view, the first adjusting metal in this embodiment may be La.

In the N-type transistor 162 in this embodiment, a lanthanum oxide film 109a is formed at the interface between the interfacial layer 107 and the high-k gate insulating film 108. By virtue of this configuration, the work function of the N-type transistor 162 can be reduced, and thereby the threshold voltage can be lowered. The N-type transistor 162 in this embodiment may be configured to have lanthanum oxide film 109b (first adjusting metal) additionally between the high-k gate insulating film 108 and the TiN film 110.

The P-type transistor 160 in this embodiment may be configured to have a lanthanum oxide film 109 (first adjusting metal) provided between the high-k gate insulating film 108a and the TiN film 110a.

In the P-type transistor 160 in this embodiment, a diffusion suppressive element capable of suppressing diffusion of the first adjusting metal resides in the high-k gate insulating film 108a. The diffusion suppressive element may be nitrogen. In this embodiment, also the N-type transistor 162 may be configured to have nitrogen residing in the high-k gate insulating film 108. In this embodiment, the concentration of the diffusion suppressive element in the high-k gate insulating film 108a of the P-type transistor 160 is higher than the concentration of the diffusion suppressive element in the high-k gate insulating film 108 of the N-type transistor 162. In other words, the high-k gate insulating film 108a in this embodiment contains a higher concentration of nitrogen than the high-k gate insulating film 108 does. In this embodiment, difference between the concentration of the diffusion suppressive element in the high-k gate insulating film 108a of the P-type transistor 160 and the concentration of the diffusion suppressive element in the high-k gate insulating film 108 of the N-type transistor 162 may be set, for example, to 15% or around.

In this embodiment, a TiN film is used as a material for composing the metal gate electrode, and for the case where the high-k gate insulating film 108 is configured by HfSiON, nitrogen derived from these films consequently resides also in the N-type transistor 162. However, in another exemplary case where the metal gate electrode and the high-k gate insulating film 108 are configured by nitrogen-free materials, the high-k gate insulating film 108 of the N-type transistor 162 may be configured to be nitrogen-free.

In this embodiment, nitrogen which is a diffusion suppressive element capable of suppressing the first adjusting metal from diffusing also resides in the TiN film 110a and the TiN film 110. The concentration of the diffusion suppressive element in the TiN film 110a of the P-type transistor 160 is higher than the concentration of the diffusion suppressive element in the TiN film 110 of the N-type transistor 162. In other words, the TiN film 110a in this embodiment contains a higher concentration of nitrogen than the TiN film 110 does.

In the N-type transistor 162 in this embodiment, the concentration of the diffusion suppressive element in the interfacial layer 107 may be set lower than the concentration of the diffusion suppressive element in the high-k gate insulating film 108. In view of keeping desirable interfacial characteristics of the N-type transistor 162, the concentration of nitrogen in the interfacial layer 107 is preferably adjusted to approximately 10% or below. Similarly in the P-type transistor 160, the concentration of the diffusion suppressive element in the interfacial layer 107 may be set lower than the concentration of the diffusion suppressive element in the high-k gate insulating film 108a.

Next, procedures of manufacturing the semiconductor device 100 in this embodiment will be explained. FIGS. 2A to 5B are sectional views illustrating procedures of manufacturing the semiconductor device 100 of this embodiment.

Figure 2A:
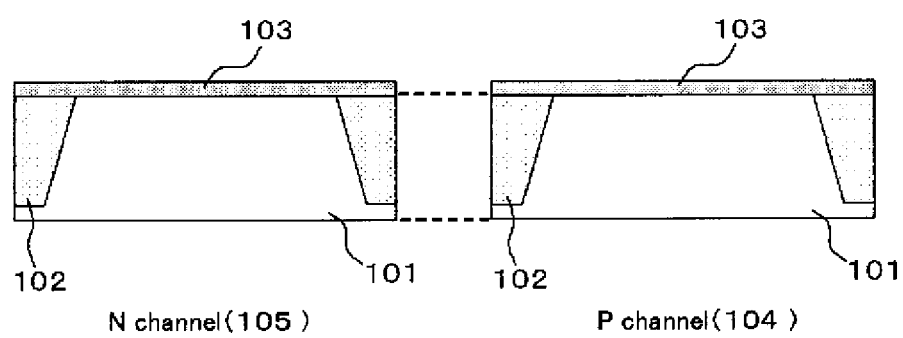
FIGS. 2A, 2B, 3A, 3B, 4A, 4B, 5A and 5B are sectional views illustrating procedures of manufacturing the semiconductor device in one embodiment of the present invention.

First, the device isolation region 102 having the STI (Shallow Trench Isolation) structure, a sacrificial oxide film 103, the p-channel region 104 and the n-channel region 105 are formed, by publicly-known procedures (FIG. 2A). The device isolation region 102 is formed in the substrate 101 and partitions the p-channel region 104 and the n-channel region 105. The sacrificial oxide film 103 is formed over the entire surface of the substrate 101.

Next, the sacrificial oxide film 103 is selectively removed in the p-channel region 104 by etching with an aqueous NH$_4$F solution or dilute hydrofluoric acid, using a resist mask (not illustrated) which is formed so as to cover the n-channel region 105. Next, SiGe is selectively grown in the surficial portion of the p-channel region 104 by an epitaxial process, to thereby form the channel SiGe layer 106. Thereafter, a Si film (not illustrated) is further formed over the channel SiGe layer 106. The resist mask (not illustrated) is then removed. Next, the sacrificial oxide film 103 is removed in the n-channel region 105, by etching with an aqueous NH$_4$F solution or dilute hydrofluoric acid.

Figure 2B:
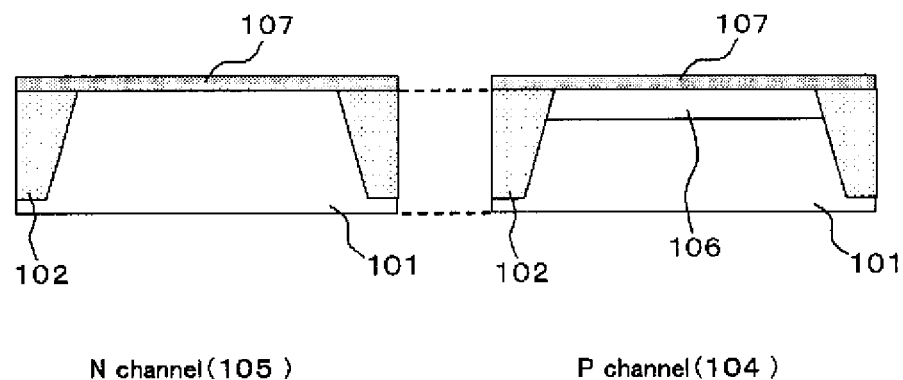

The interfacial layer 107 is then formed over the p-channel region 104 and the n-channel region 105 (FIG. 2B). The interfacial layer 107 herein may be a silicon oxide film (chemical SiO$_2$ film) or a silicon oxynitride film (SiON film). The silicon oxide film may be formed by thermal oxidation.

On the other hand, the silicon oxynitride film may be formed typically by a step of forming a chemical $SiO_2$ film, a step of nitriding the chemical $SiO_2$ film (plasma nitriding, for example), and a step of re-oxidizing the thus-nitrided chemical $SiO_2$ film (oxidative annealing in oxygen, for example).

Next, the Hf-containing, high-k gate insulating film 108 is formed over the entire surface of the interfacial layer 107. The high-k gate insulating film 108 herein may be configured by, for example, a HfSiON film (hafnium oxynitride film). The HfSiON film may typically be formed by the procedures below. First, a HfSiO film (hafnium oxide film, not illustrated) is formed over the entire surface of the interfacial layer 107, typically by a metal organic chemical vapor deposition (MOCVD) process. Next, the HfSiO film is treated in a nitrogen plasma atmosphere, followed by annealing, to thereby modify the film into a HfSiON film. By allowing the high-k gate insulating film 108 to contain nitrogen in the N-type transistor 162, the N-type transistor 162 may now ensure a high reliability, as described later. From this point of view, the concentration of nitrogen in the high-k gate insulating film 108 of the N-type transistor 162 may be adjusted typically to 20% or more. In addition, by allowing the high-k gate insulating film 108 to contain nitrogen, the high-k gate insulating film may be prevented from crystallizing during annealing in the processes for forming the transistor, and may be improved in reliability (insulation characteristic).

Figure 3A:
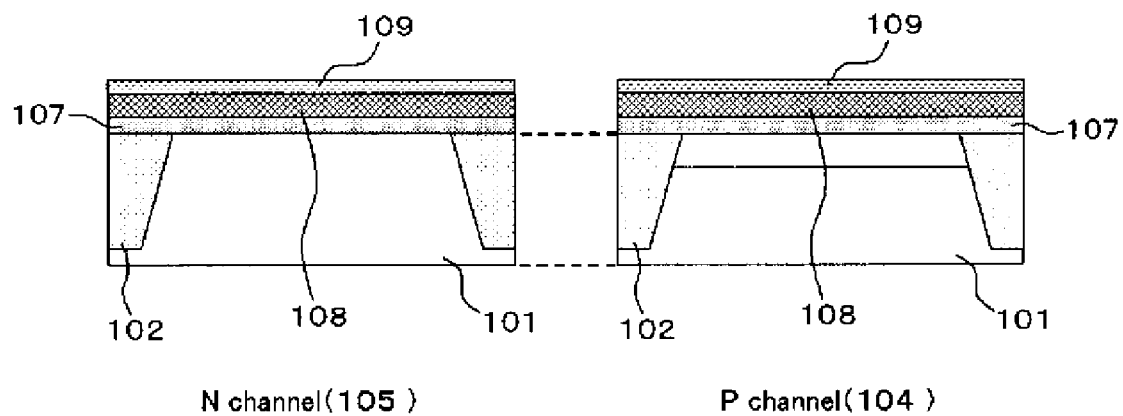

Thereafter, a lanthanum oxide film 109 (typically to as thick as 1 nm or less) is formed over the entire surface of the high-k gate insulating film 108 (FIG. 3A). The lanthanum oxide film 109 may be formed typically by a physical vapor deposition (PVD) process.

Figure 3B:
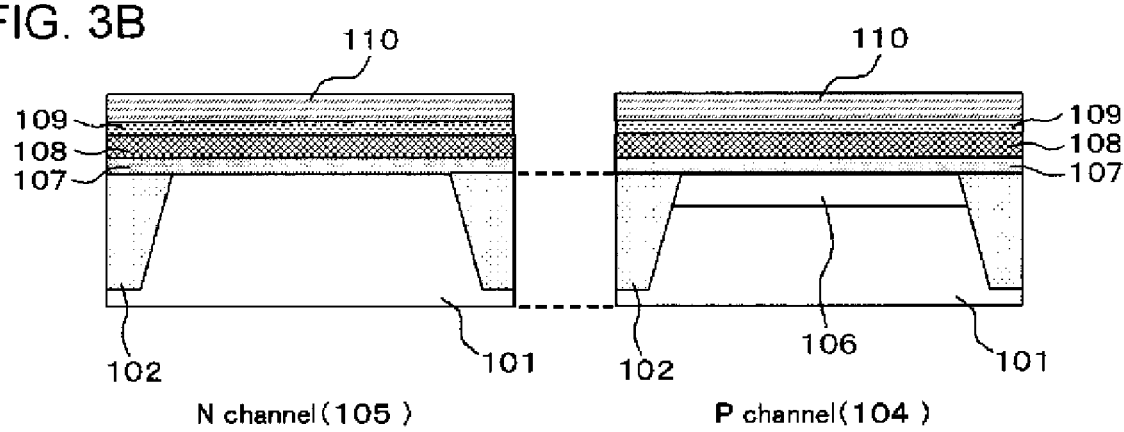

Next, the TiN film 110 is formed over the entire surface of the lanthanum oxide film 109 (FIG. 3B). The TiN film 110 may be formed typically by reactive sputtering using a TiN target, reactive sputtering using a Ti target proceeded while introducing nitrogen into the atmosphere to thereby form TiN, CVD process, or atomic layer deposition (ALD).

Figure 4A:
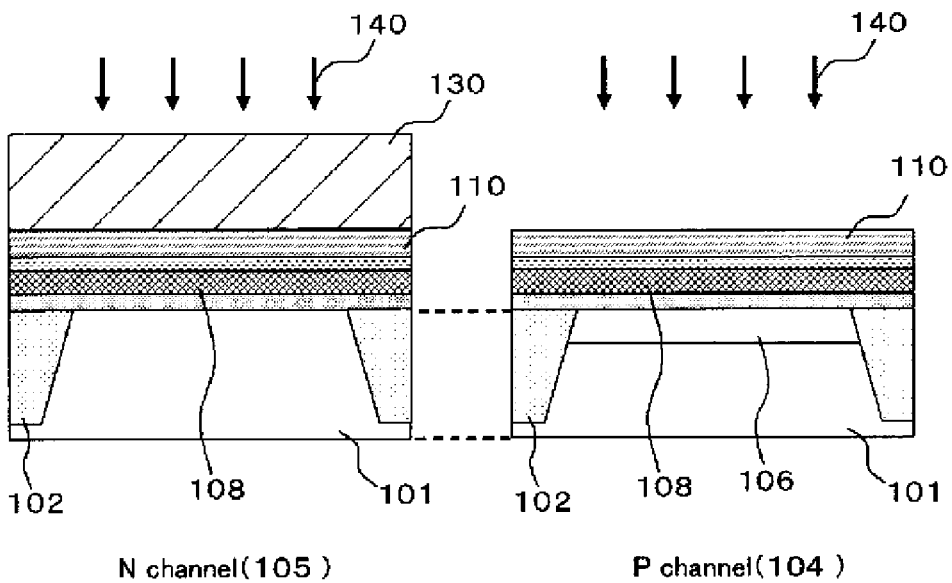
Figure 4B:
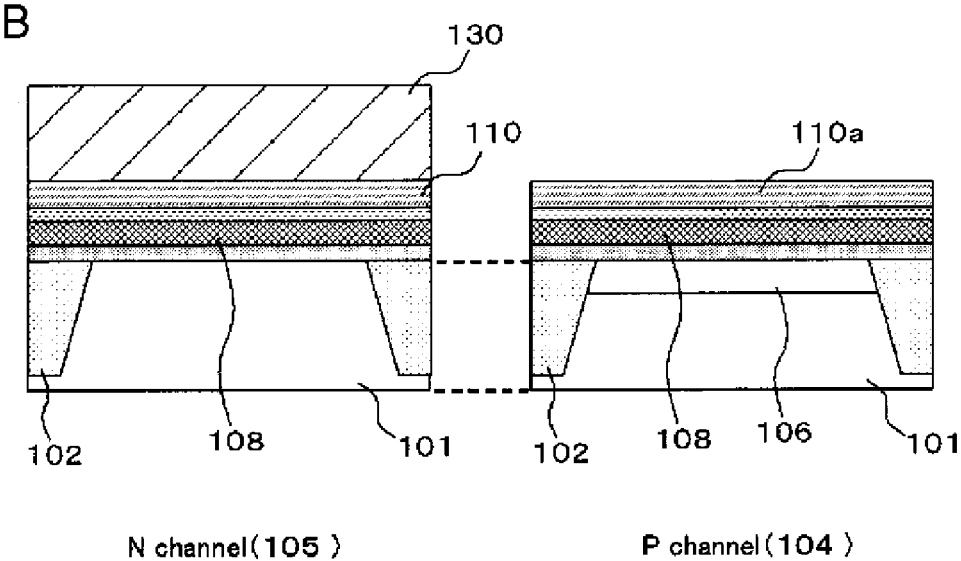

Next, nitrogen 140 is added to the TiN film 110 in the p-channel region 104, by nitrogen plasma irradiation, or nitrogen ion implantation, using a resist mask 130 which is formed so as to cover the n-channel region 105 (FIG. 4A). As a consequence, the TiN film 110 in the p-channel region 104 will be converted into the TiN film 110a having a nitrogen concentration higher than that in the TiN film 110 formed in the n-channel region 105 (FIG. 4B). The resist mask 130 is then removed.

Figure 5A:
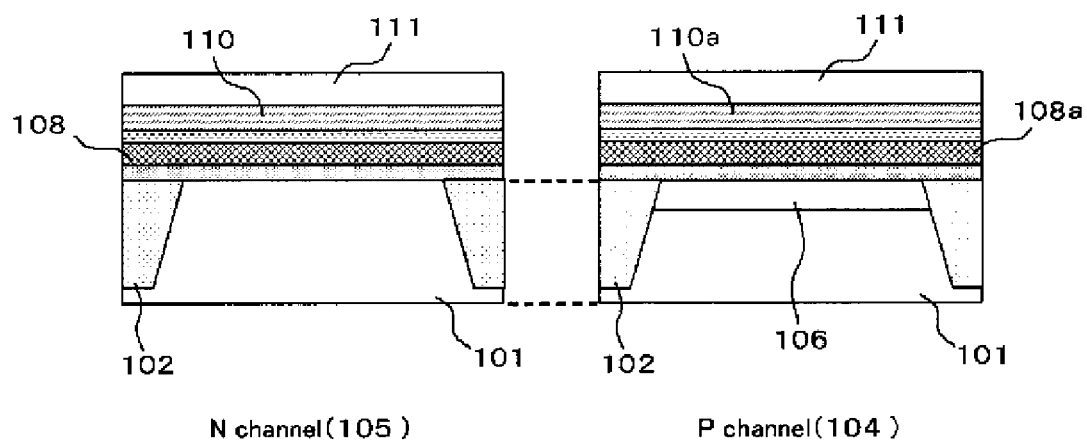

Next, the Si film 111 is formed over the entire surfaces of the TiN film 110 and the TiN film 110a (FIG. 5A). The Si film 111 may be configured by polysilicon. In the process of annealing for forming the Si film 111, nitrogen in the TiN film 110 and the TiN film 110a diffuses into the high-k gate insulating film 108. Since the TiN film 110a has a nitrogen concentration higher than that in the TiN film 110, so that the high-k gate insulating film 108 in the P-type channel region 104 will have a nitrogen concentration higher than that in the high-k gate insulating film 108 in the N-type channel region 105. For clear discrimination, the high-k gate insulating film 108 in the P-type channel region 104 will now be denoted as the high-k gate insulating film 108a.

Figure 5B:
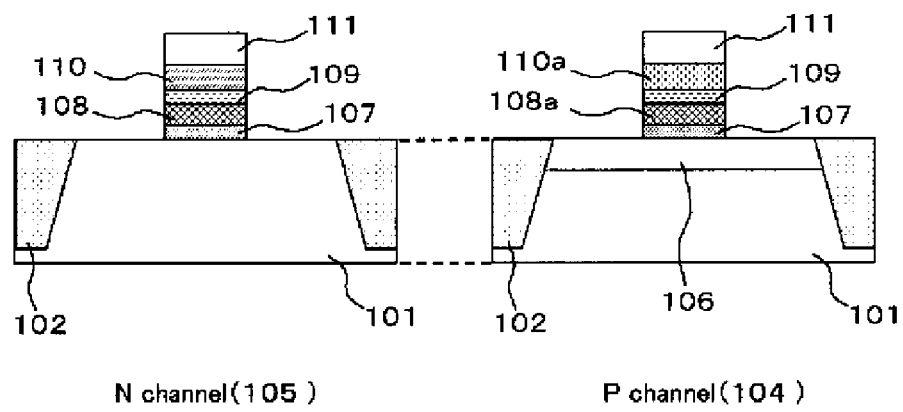

Next, the Si film 111, the TiN film 110 and the TiN film 110a are processed by reactive ion etching (RIE) using a hard mask (not illustrated), into the gate geometry. The lanthanum oxide film 109, the high-k gate insulating film 108, the high-k gate insulating film 108a and the interfacial layer 107, laid thereunder, are then further etched into the gate geometry (FIG. 5B).

Next, an insulating film is formed over the entire surface of the substrate 101 typically by CVD, and the insulating film is then etched by RIE, to thereby form offset spacers (not illustrated). The offset spacers may be configured typically by a silicon oxide film or silicon nitride film. An insulating film is further deposited over the entire surface of the substrate 101 typically by CVD, and the insulating film is then etched by RIE, to thereby form the side wall spacers. The side wall spacers may be configured by a silicon nitride film or silicon oxide film.

Next, boron (B) is introduced into the p-channel region 104 by ion implantation, using a resist mask (not illustrated) which covers the n-channel region 105, to thereby form the P-type source/drain diffusion layers 113, and the resist mask is then removed. Similarly, phosphorus (P) or arsenic (As) is introduced into the re-channel region 105 by ion implantation, using a resist mask (not illustrated) which covers the p-channel region 104, to thereby form the N-type source/drain diffusion layers 114, and the resist mask is then removed. The product is then annealed.

Next, the unillustrated side wall spacers are removed, boron (B) is introduced into the p-channel region 104 by ion implantation, using a resist mask (not illustrated) which covers the n-channel region 105, to thereby form the P-type extension diffusion layers 115, and the resist mask is then removed. Similarly, phosphorus (P) or arsenic (As) is introduced into the n-channel region 105 by ion implantation, using a resist mask (not illustrated) which covers the p-channel region 104, to thereby form the N-type extension diffusion layers 116, and the resist mask is then removed. The product is then annealed.

In this process, nitrogen contained in the TiN film 110 and the TiN film 110a diffuses into the high-k gate insulating film 108, also by the annealing for forming the P-type source/drain diffusion layers 113, the N-type source/drain diffusion layers 114, P-type extension diffusion layers 115 and the N-type extension diffusion layers 116. Also lanthanum oxide composing the lanthanum oxide film 109 diffuses in the process of annealing. The annealing herein allows nitrogen and lanthanum oxide to diffuse, wherein nitrogen atom is smaller and lighter than lanthanum atom, and therefore nitrogen atom diffuses more rapidly than lanthanum oxide. Accordingly, nitrogen is introduced into the high-k gate insulating film 108 earlier than lanthanum oxide migrates thereinto. As a consequence, in the P-type transistor 160 where a higher concentration of nitrogen is contained in the TiN film 110a, the nitrogen concentration becomes higher also in the high-k gate insulating film 108a, enough to suppress diffusion of lanthanum oxide. Lanthanum oxide in the lanthanum oxide film 109, therefore, hardly diffuses into the high-k gate insulating film 108a, and remains on the high-k gate insulating film 108a.

On the other hand, in the n-channel region 105, lanthanum oxide which composes the lanthanum oxide film 109 diffuses through the high-k gate insulating film 108, and deposits between the interfacial layer 107 and the high-k gate insulating film 108. In this way, the lanthanum oxide film 109a having a thickness not larger than a predetermined value is formed between the interfacial layer 107 and the high-k gate insulating film 108 in the N-channel region 105. A part of the lanthanum oxide film 109 (lanthanum oxide film 109b) remains on the high-k gate insulating film 108. Accordingly, the thickness of the lanthanum oxide film 109a will not exceed the thickness of the lanthanum oxide film 109. Note that, while lanthanum oxide in the lanthanum oxide film 109 might diffuse through the high-k gate insulating film 108a, and might deposit at the interface between the high-k gate insulating film 108a and the interfacial layer 107 also in the P-type transistor 160, the amount of deposition may be suppressed to an extremely low level, as compared with the amount of lanthanum oxide in the lanthanum oxide film 109a in the N-type transistor 162.

The annealing for forming the lanthanum oxide film 109a is not specifically limited so far as it takes place after the lanthanum oxide film 109 is formed and nitrogen was introduced. Alternatively, an additional process of annealing specialized for formation of the lanthanum oxide film 109a may be adoptable.

Next, double-layered side wall spacers 117 composed of the silicon oxide film 118 and the silicon nitride film 119 are formed by CVD and RIE. Thereafter, the silicide layers 120 are formed in the surficial portions of the P-type source/drain diffusion layers 113, the N-type source/drain diffusion layers 114, and the Si film 111 by the publicly-known SALISIDE process. Accordingly, the gate electrodes having a stacked structure, represented by silicide/Si/metal gate, are formed in the P-type transistor 160 and the N-type transistor 162.

Thereafter, formation of an insulating interlayer, formation and filling of contact holes, formation of interconnects and so forth are carried out similarly to the conventional transistor process, to thereby form a semiconductor integrated circuit which contains a complementary transistor.

Next, effects of the semiconductor device 100 of this embodiment will be explained.

In the N-type transistor 162, La diffused at the interface between the high-k gate insulating film 108 and the interfacial layer 107 forms a dipole (La interfacial dipole). As a consequence, the flat band voltage ($V_{FB}$) may be shifted towards the negative bias side, and thereby EWF may be reduced, and $V_{th}$ may be lowered. On the other hand, presence of nitrogen in the interfacial layer 107 of the N-type transistor 162 may otherwise suppress the effect of lowering $V_{th}$ by the dipole. However, since the nitrogen concentration in the TiN film 110 of the N-type transistor 162 in this embodiment is low, so that also the nitrogen concentration in the high-k gate insulating film 108 and the interfacial layer 107 of the N-type transistor 162 can be adjusted to low levels, and thereby the effect of lowering $V_{th}$ by the dipole can be prevented from being suppressed. In addition, since La diffuses at the interface between the interfacial layer 107 and the high-k gate insulating film 108 in this embodiment, also migration of nitrogen into the interfacial layer 107 can be suppressed. Also the high-k gate insulating film 108 in the N-type transistor 162 may, therefore, be configured to contain nitrogen. By virtue of this configuration, the high-k gate insulating film 108 can be suppressed from crystallizing in the process of annealing for forming the transistor, and thereby the reliability (insulation characteristic) can be improved.

Moreover, in this embodiment, the nitrogen concentration in the high-k gate insulating film 108a of the P-type transistor 160 is set higher than that in the high-k gate insulating film 108 of the N-type transistor 162. Since nitrogen suppresses diffusion of La, so that diffusion of La in the high-k gate insulating film 108a may be suppressed in the P-type transistor 160 having a higher nitrogen concentration. Accordingly, the amount of La at the interface between the high-k gate insulating film 108a and the interfacial layer 107 may be adjusted to an extremely low level in the P-type transistor 160.

In this embodiment, the nitrogen concentration in the high-k gate insulating film 108a of the P-type transistor 160 is set higher than the nitrogen concentration in the high-k gate insulating film 108 of the N-type transistor 162. Since nitrogen acts as a negative fixed charge, so that $V_{th}$ of the P-type transistor 160 can be lowered, by setting the nitrogen concentration in the high-k gate insulating film 108a of the P-type transistor 160 to a high level.

As has been explained in the above, nitrogen is selectively added to the P-type channel region 104, using the resist mask. In this process, removal of the resist mask after addition of nitrogen may otherwise induce thinning of the underlying film, even if it should be a slight level. Change in the thickness of the gate insulating film may undesirably result in variation in $V_{th}$ and $T_{inv}$ of the transistor. In this embodiment, nitrogen is added after forming the resist mask 130 selectively over the TiN film 110 in the N-type channel region 105, as illustrated in FIG. 4A. Nitrogen may, therefore, be implanted selectively into the P-type channel region 104 without exerting direct influences on the high-k gate insulating film 108 of the N-type transistor 162, to give the TiN film 110a the P-type transistor 160 having a high nitrogen concentration. Nitrogen in the TiN film 110a then diffuses into the underlying high-k gate insulating film 108, and thereby the high-k gate insulating film 108a having a high nitrogen concentration may be obtained in the P-type transistor 160.

As has been described in the above, according to this embodiment, by controlling the nitrogen contents in the TiN film 110a/TiN film 110, in the high-k gate insulating film 108a/high-k gate insulating film 108, and in the interfacial layer 107 differently for the N-type and P-type transistors, the amount of La, possibly diffused at the interface between the interfacial layer 107 and the high-k gate insulating film 108a/high-k gate insulating film 108, can be set differently from each other between the N-type and P-type transistors. The effect of the interfacial dipole can therefore be controlled, and thereby $V_{th}$ of the N-type and P-type transistors can differently be adjustable. In conclusion, according to the present invention, $V_{th}$ may differently be adjustable for the N-type and P-type transistors, without selectively forming the first adjusting metal, which may vary the threshold voltage, in the N-type and P-type transistors, and thereby the process can be simplified.

(Second Embodiment)

In this embodiment, the first conductivity type may represent P-type, and the second conductivity type may represent N-type.

Figure 6:
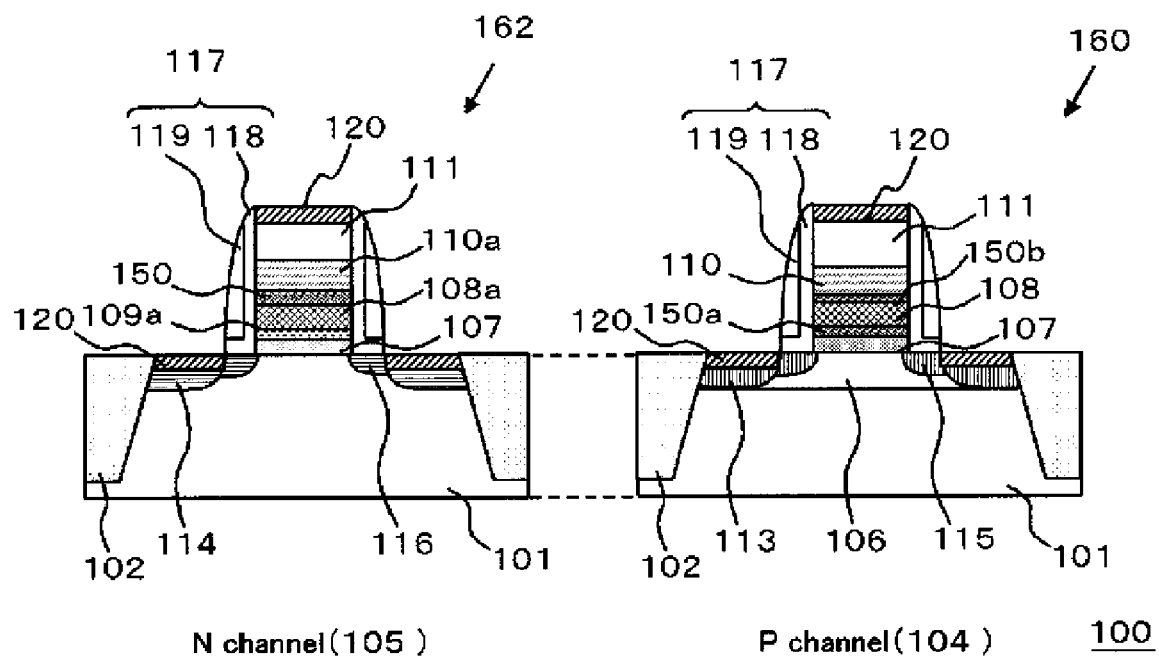
FIG. 6 is a sectional view illustrating a configuration of a semiconductor device in another embodiment of the present invention.

FIG. 6 is a sectional view illustrating a configuration of the semiconductor device of this embodiment. The cross section herein is taken in the direction of channel length of the transistor.

The semiconductor device 100 includes the substrate 101, the device isolation region 102 formed in the surficial portion of the substrate 101, the P-type channel region 104 (denoted as P channel in the drawing) and the N-type channel region 105 (denoted as N channel in the drawing) partitioned by the device isolation region 102, and the P-type transistor 160 and the N-type transistor 162 respectively formed in the P-type channel region 104 and the N-type channel region 105 of the substrate 101. In this embodiment, the channel SiGe layer 106 is formed in the surficial portion of the substrate 101 in the P-type channel region 104.

The explanation herein will deal with only aspects different from those of the semiconductor device 100 previously explained referring to FIG. 1 in the first embodiment.

The P-type transistor 160 has the interfacial layer 107 formed over the substrate 101, the high-k gate insulating film 108 containing Hf and formed over the interfacial layer 107, and the TiN film 110, which is a metal gate electrode, formed over the high-k gate insulating film 108.

The N-type transistor 162 has the interfacial layer 107 formed over the substrate 101, the high-k gate insulating film 108a containing Hf and formed over the interfacial layer, and the TiN film 110a, which is a metal gate electrode, formed over the high-k gate insulating film 108a.

In this embodiment, in the P-type transistor 160, the first adjusting metal, capable of varying the threshold voltage of the P-type transistor, resides at the interface between the interfacial layer 107 and the high-k gate insulating film 108. In this embodiment, the first adjusting metal may be an element capable of reducing the work function of the P-type transistor, and of lowering the threshold voltage. The first adjusting metal in this embodiment may be Al.

In this embodiment, in the P-type transistor 160, an aluminum oxide film 150a is formed at the interface between the interfacial layer 107 and the high-k gate insulating film 108.

By virtue of this configuration, the work function of the P-type transistor 160 mcan be reduced, and the threshold voltage thereof can be lowered. The P-type transistor 160 in this embodiment may have an aluminum oxide film 150b (first adjusting metal) also between the high-k gate insulating film 108 and the TiN film 110.

On the other hand, the N-type transistor 162 in this embodiment may be configured to have an aluminum oxide film 150 (first adjusting metal) provided between the high-k gate insulating film 108a and the TiN film 110a.

In this embodiment, a diffusion suppressive element, capable of suppressing diffusion of the first adjusting metal, resides in the high-k gate insulating film 108a of the N-type transistor 162. The diffusion suppressive element may be nitrogen. On the other hand, in this embodiment, also the P-type transistor 160 may be configured to contain nitrogen in the high-k gate insulating film 108. In this embodiment, the concentration of the diffusion suppressive element in the high-k gate insulating film 108a of the N-type transistor 162 is higher than the concentration of the diffusion suppressive element in the high-k gate insulating film 108 of the P-type transistor 160. In other words, in this embodiment, the high-k gate insulating film 108a contains a larger concentration of nitrogen than the high-k gate insulating film 108 does. In this embodiment, difference between the concentration of the diffusion suppressive element in the high-k gate insulating film 108 of the P-type transistor 160 and the concentration of the diffusion suppressive element in the high-k gate insulating film 108a of the N-type transistor 162 may be set, for example, to 15% or around. The concentration of nitrogen, which is a diffusion suppressive element, in the high-k gate insulating film 108a of the N-type transistor 162 may be adjusted, for example, to 20% or above.

In this embodiment, a TiN film is used as a material for composing the metal gate electrode, and for the case where the high-k gate insulating film 108 is configured by HfSiON, nitrogen derived from these films consequently resides also in the P-type transistor 160. However, in another exemplary case where the metal gate electrode and the high-k gate insulating film 108 are configured by nitrogen-free materials, the high-k gate insulating film 108 of the P-type transistor 160 may be configured to be nitrogen-free.

In this embodiment, the diffusion suppressive element capable of suppressing diffusion of the first adjusting metal resides also in the TiN film 110 and the TiN film 110a. In addition, the concentration of the diffusion suppressive element in the TiN film 110a of the N-type transistor 162 is higher than the concentration of the diffusion suppressive element in the TiN film 110 of the P-type transistor 160. In short, in this embodiment, the TiN film 110a contains a higher concentration of nitrogen than the TiN film 110 does.

Moreover, the N-type transistor 162 in this embodiment may be configured to contain a second adjusting metal, capable of varying the threshold voltage of the N-type transistor, at the interface between the interfacial layer 107 and the high-k gate insulating film 108a. The second adjusting metal may be an element capable of reducing the work function of the N-type transistor, and of lowering the threshold voltage. The second adjusting metal may also be an element capable of suppressing nitrogen, which is the diffusion suppressive element, from diffusing into the interfacial layer 107. The second adjusting metal may be La, for example. In the N-type transistor 162 exemplified herein, the lanthanum oxide film 109a is formed at the interface between the interfacial layer 107 and the high-k gate insulating film 108a.

The N-type transistor 162 may be configured so that the concentration of the diffusion suppressive element in the interfacial layer 107 is set lower than in the high-k gate insulating film 108a. In this embodiment, since the lanthanum oxide film 109a is formed between the high-k gate insulating film 108a and the interfacial layer 107 of the N-type transistor 162, nitrogen may be suppressed from diffusing by the contribution of the lanthanum oxide film 109a, and thereby the interfacial layer 107 may be prevented from being introduced with nitrogen. Also the P-type transistor 160 may similarly be configured so that the concentration of the diffusion suppressive element in the interfacial layer 107 is set lower than in the high-k gate insulating film 108.

Next, procedures of manufacturing the semiconductor device 100 in this embodiment will be explained. FIGS. 7A to 9B are sectional views illustrating procedures of manufacturing the semiconductor device 100 of this embodiment.

Figure 7A:
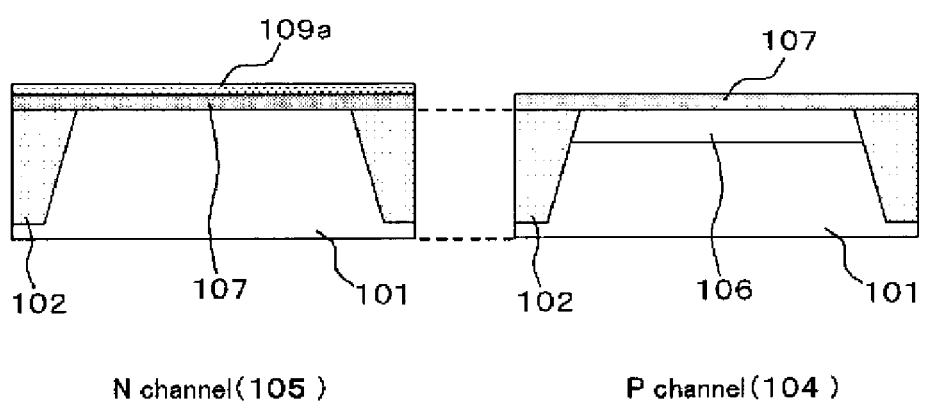
FIGS. 7A, 7B, 8A, 8B, 9A and 9B are sectional views illustrating procedures of manufacturing the semiconductor device in another embodiment of the present invention.

Also in this embodiment, similarly to as explained in the first embodiment referring to FIGS. 1A and 1B, the interfacial layer 107 is formed over the entire surface of the substrate 101. Thereafter, the lanthanum oxide film 109a (typically to as thick as 0.3 nm or around) is formed over the entire surface of the interfacial layer 107 typically by PVD, and a portion of the lanthanum oxide film 109a which falls in the p-channel region 104 is then removed by etching using an unillustrated resist mask. The resist mask is then removed. In this way, the lanthanum oxide film 109a is formed over the interfacial layer 107, selectively in the n-channel region 105 (FIG. 7A).

Figure 7B:
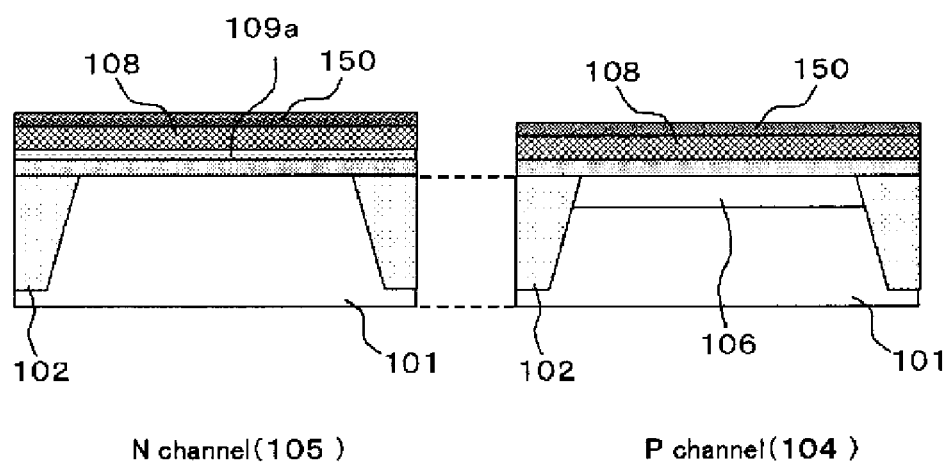

Next, the high-k gate insulating film 108 containing Hf is formed over the entire surface of the substrate 101. The aluminum oxide film 150 (typically to as thick as 1 nm or below) is then formed over the entire surface of the high-k gate insulating film 108, typically by PVD (FIG. 7B).

Figure 8A:
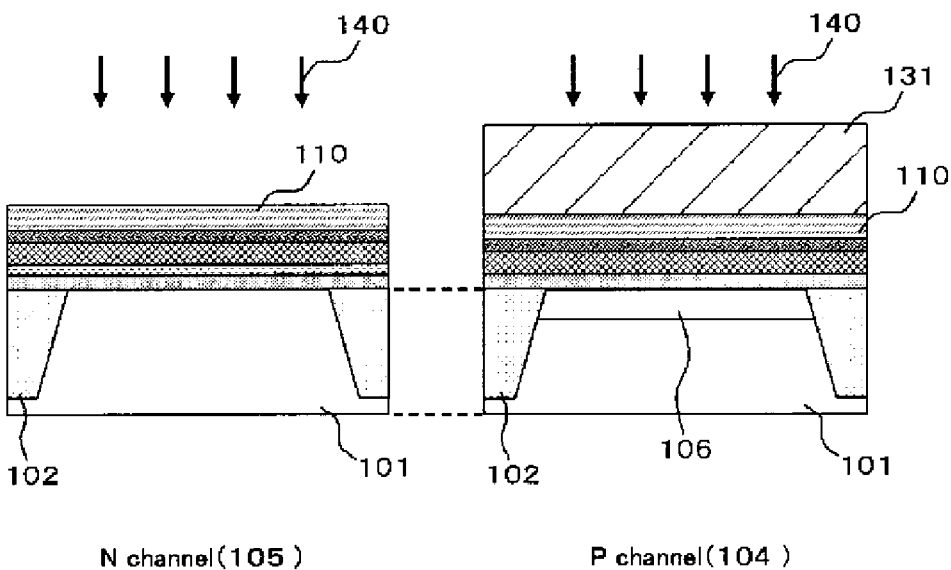
Figure 8B:
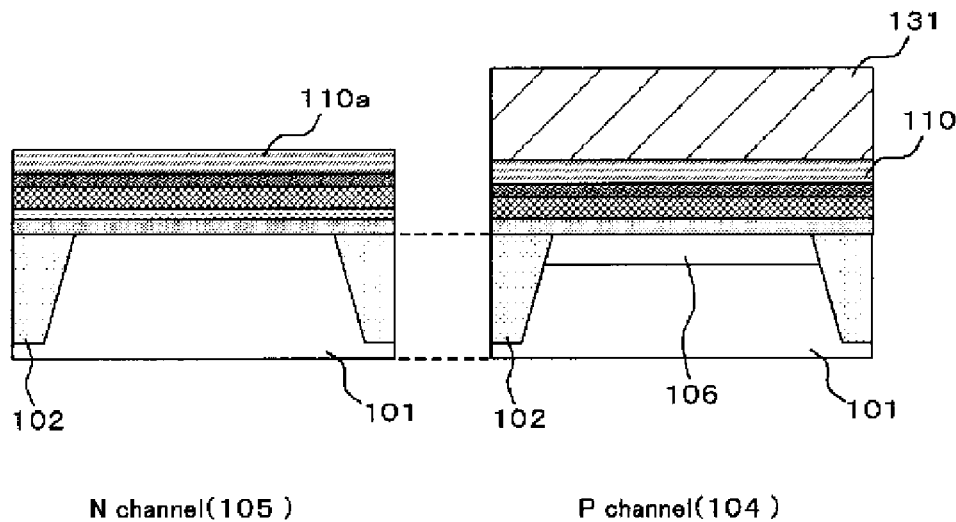

The TiN film 110 is then formed over the entire surface of the aluminum oxide film 150. Next, nitrogen 140 is added to the TiN film 110 in the n-channel region 105, using a resist mask 131 which covers the p-channel region 104, typically by nitrogen plasma irradiation, nitrogen ion implantation or the like (FIG. 8A). In this way, in the n-channel region 105, the TiN film 110 will be given as the TiN film 110a, having a nitrogen concentration higher than that in the TiN film 110 formed in the P-channel region 104 (FIG. 8B). The resist mask 131 is then removed.

Figure 9A:
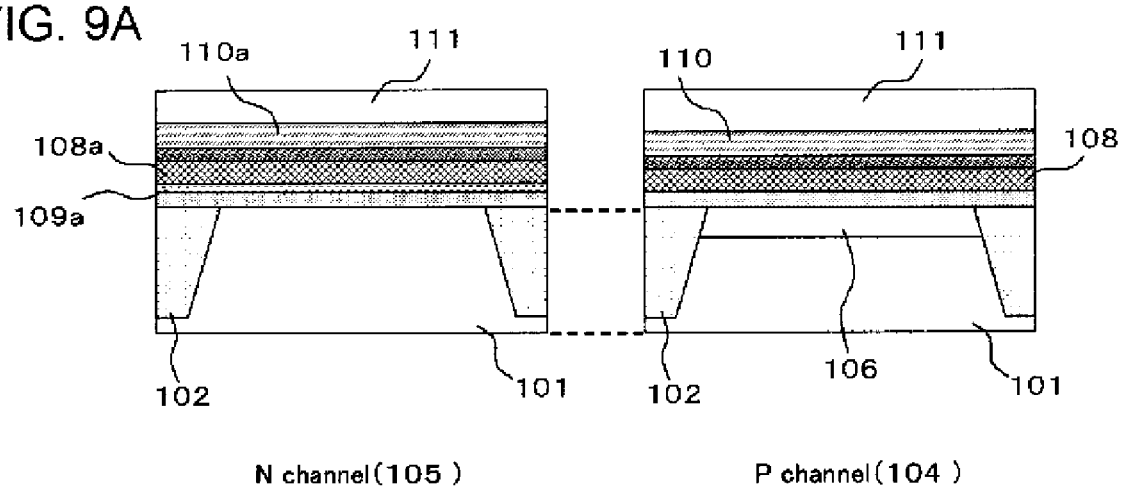

Next, the Si film 111 is formed over the entire surfaces of the TiN film 110 and the TiN film 110a (FIG. 9A). In this process, nitrogen contained in the TiN film 110 and the TiN film 110a diffuses into the high-k gate insulating film 108, by the annealing for forming the Si film 111. Since the TiN film 110a has a higher nitrogen concentration than the TiN film 110 has, so that the high-k gate insulating film 108 in the N-type channel region 105 will have a nitrogen concentration higher than that in the high-k gate insulating film 108 in the P-type channel region 104. For clear discrimination, the high-k gate insulating film 108 in the N-type channel region 105 will now be denoted as the high-k gate insulating film 108a.

Figure 9B:
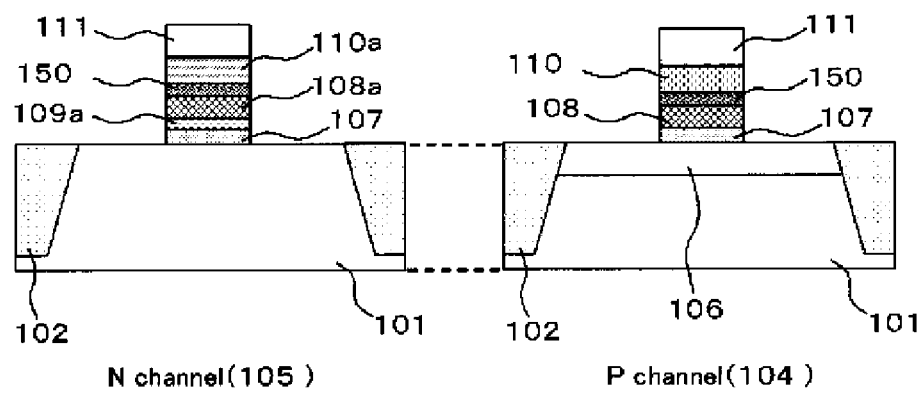

Next, similarly to as explained in the first embodiment, the Si film 111, the TiN film 110 or TiN film 110a, the aluminum oxide film 150, the high-k gate insulating film 108 or high-k gate insulating film 108a, the lanthanum oxide film 109a, and the interfacial layer 107 are processed into a gate geometry (FIG. 9B). Thereafter, by procedures similar to those explained in the first embodiment, the P-type source/drain diffusion layers 113 and the N-type source/drain diffusion layers 114, the P-type extension diffusion layers 115 and the N-type extension diffusion layers 116, the side wall spacers 117, and the silicide layers 120 are formed (FIG. 6).

Also in this embodiment, nitrogen contained in the TiN film 110 and the TiN film 110a diffuses into the high-k gate insulating film 108a or the high-k gate insulating film 108, in the process of annealing for forming the P-type source/drain diffusion layers 113, the N-type source/drain diffusion layers 114, the P-type extension diffusion layers 115, and the N-type extension diffusion layers 116. Also aluminum oxide composing the aluminum oxide film 150 diffuses in the process of annealing. The annealing herein allows nitrogen and aluminum oxide to diffuse, wherein nitrogen atom is smaller and lighter than aluminum atom, and therefore more rapidly diffuses than aluminum oxide. Accordingly, nitrogen is introduced into the high-k gate insulating film 108 earlier than aluminum oxide migrates thereinto.

Now, in the N-type transistor 162 where a higher concentration of nitrogen is contained in the TiN film 110a, the nitrogen concentration becomes higher also in the high-k gate insulating film 108a, enough to suppress diffusion of aluminum oxide. Aluminum oxide in the aluminum oxide film 150, therefore, hardly diffuses into the high-k gate insulating film 108a, and remains on the high-k gate insulating film 108a. As a consequence, the amount of aluminum which resides between the high-k gate insulating film 108a and the interfacial layer 107 in the N-type transistor 162 can be reduced.

On the other hand, in the P-type channel region 104, aluminum oxide which composes the aluminum oxide film 150 diffuses through the high-k gate insulating film 108, and deposits between the interfacial layer 107 and the high-k gate insulating film 108. In this way, the aluminum oxide film 150a having a thickness not larger than a predetermined value is formed between the interfacial layer 107 and the high-k gate insulating film 108 in the P-channel region 104. A part of the aluminum oxide film 150 (aluminum oxide film 150b) remains on the high-k gate insulating film 108. Accordingly, the thickness of the aluminum oxide film 150a will not exceed the thickness of the aluminum oxide film 150. Note that, while aluminum oxide in the aluminum oxide film 150 might diffuse through the high-k gate insulating film 108a and might deposit at the interface with the interfacial layer 107 also in the N-type transistor 162, the amount of deposition will be extremely small, as compared with the amount of aluminum oxide in the aluminum oxide film 150a in the P-type transistor 160.

The annealing for forming the aluminum oxide film 150a is not specifically limited so far as it takes place after the aluminum oxide film 150 is formed and nitrogen was introduced. Alternatively, an additional process of annealing specialized for formation of the aluminum oxide film 150a may be adoptable. Thereafter, a semiconductor integrated circuit which contains a complementary transistors may be formed, by the procedures similar to those explained in the first embodiment.

Next, effects of the semiconductor device 100 of this embodiment will be explained.

In the P-type transistor 160, aluminum diffused at the interface between the high-k gate insulating film 108 and the interfacial layer 107 forms a dipole (Al interfacial dipole). As a consequence, the flat band voltage ($V_{FB}$) can be shifted towards the negative bias side, and thereby EWF can be reduced, and $V_{th}$ can be lowered.

On the other hand, if aluminum should reside between the high-k gate insulating film 108a and the interfacial layer 107 in the N-type transistor 162, the dipole (Al interfacial dipole) may be formed, and thereby a positive shift of $V_{FB}$ may undesirably increase. This embodiment may, however, prevent $V_{FB}$ from being increased in the positive shift, since aluminum does not reside between the high-k gate insulating film 108a and the interfacial layer 107 in the N-type transistor.

Presence of nitrogen in the interfacial layer 107 of the N-type transistor 162 may otherwise suppress the effect of lowering $V_{th}$ by the dipole. In this embodiment, since the lanthanum oxide film 109a is provided between the interfacial layer 107 and the high-k gate insulating film 108a in the N-type transistor 162. Nitrogen contained in the high-k gate insulating film 108a may therefore be suppressed from diffusing into the interfacial layer 107. As a consequence, the nitrogen concentration in the interfacial layer 107 of the N-type transistor 162 may be kept at a low level, and thereby elevation of $V_{th}$ and degradation in the interfacial characteristics of the N-type transistor 162, due to suppression of the $V_{th}$ shift ascribable to nitrogen diffused into the interfacial layer 107, may be suppressed.

In this embodiment, the nitrogen concentration in the high-k gate insulating film 108 of the P-type transistor 160 is lower than the nitrogen concentration in the high-k gate insulating film 108a of the N-type transistor 162. By lowering the nitrogen concentration in the high-k gate insulating film 108 of the P-type transistor 160, also the nitrogen concentration in the underlying interfacial layer 107 can be reduced. Accordingly, the NBTI (negative bias temperature instability) characteristic of the P-type transistor can be improved.

Also in this embodiment, similarly to as explained in the first embodiment, the TiN film 110a having a high nitrogen concentration may be obtained by selectively introducing nitrogen only into the N-type channel region 105 by ion implantation, without exerting direct influences on the high-k gate insulating film 108 the P-type transistor 160. Nitrogen in the TiN film 110a then diffuses into the underlying high-k gate insulating film 108, and thereby the high-k gate insulating film 108a having a high nitrogen concentration can be obtained in the N-type transistor 162.

As has been described in the above, according to this embodiment, by controlling the nitrogen content in the TiN film 110a/TiN film 110, the high-k gate insulating film 108a/high-k gate insulating film 108, and the interfacial layer 107 differently between the N-type and P-type transistors, the amount of aluminum possibly diffused at the interface between the interfacial layer 107 and the high-k gate insulating film 108a/high-k gate insulating film 108 may differently be adjustable for the N-type and P-type transistors. By controlling the effect of the interfacial dipole in this way, $V_{th}$ of the N-type and P-type transistors can differently be adjustable. In conclusion, according to the present invention, the $V_{th}$ may differently be adjustable for the N-type and P-type transistors. According to the present invention, $V_{th}$ can differently be adjustable for the N-type and P-type transistors, without selectively forming the first adjusting metal, which may vary the threshold voltage, and thereby the process may be simplified.

Next, a preferable nitrogen concentration in the high-k gate insulating film and in the interfacial layer of the N-type transistor 162 will be explained. The high-k gate insulating film herein adopts a HfSiON film.

Figure 10:
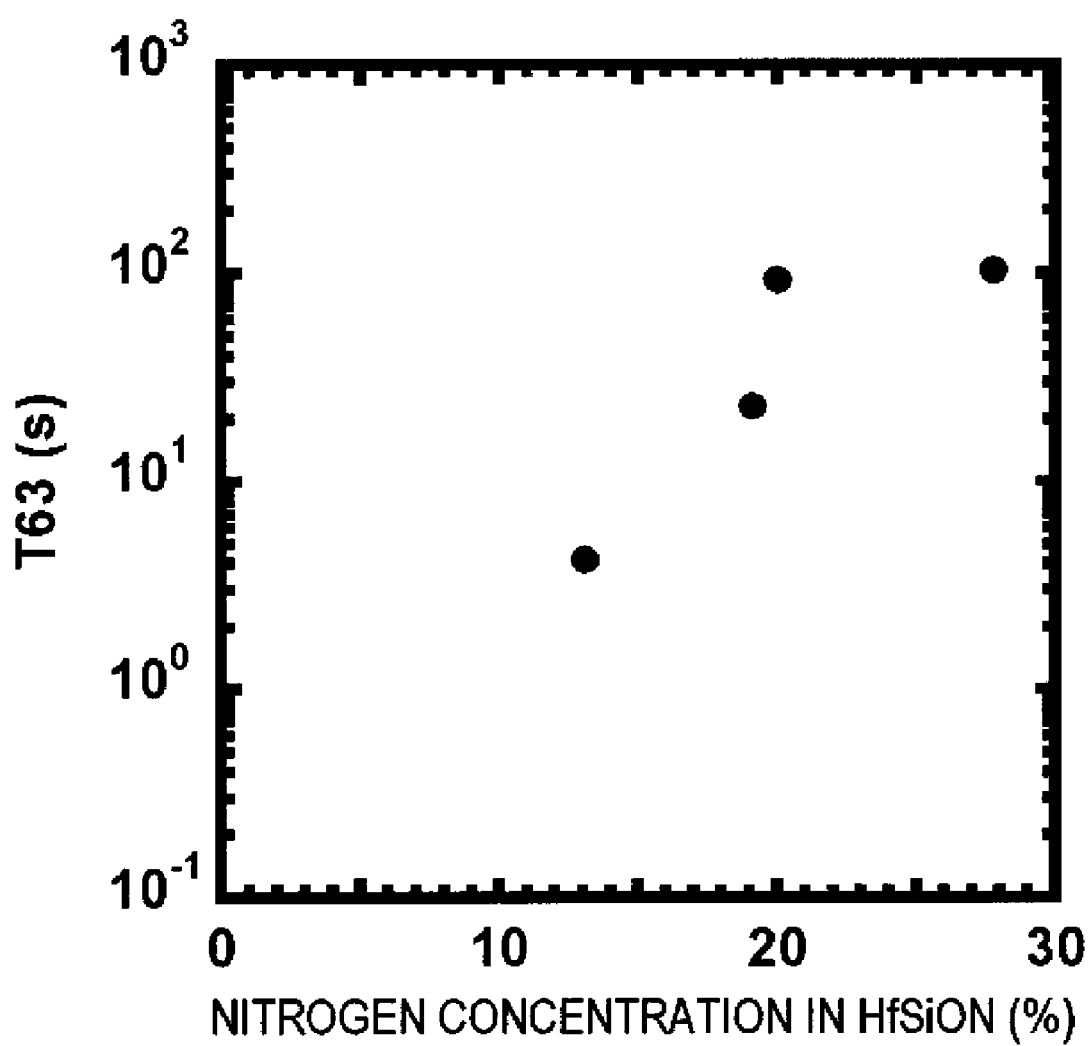
FIG. 10 is a drawing illustrating relations between nitrogen concentration in a high-k gate insulating film and T63 of an N-type transistor.

FIG. 10 is a drawing illustrating relations between the nitrogen concentration (atomic %) in the high-k gate insulating film 108 (108a) of the N-type transistor 162, and T63 (time after which 63% of the samples fail) which is one of index representing time-dependent dielectric breakdown (TDDB) characteristic. Conditions of measurement herein include a substrate temperature of 125° C., and an electric field applied to the oxide film, on the basis of silicon oxide film, of 15 MV/cm.

It is found from the results shown in FIG. 10 that T63 increases as the nitrogen concentration in the HfSiON film increases, and saturates at a nitrogen concentration of 20% or higher. In view of keeping an excellent reliability, the nitrogen concentration in the HfSiON gate insulating film, which is a high-k gate insulating film, may be adjusted to 20% or higher.

Figure 11:
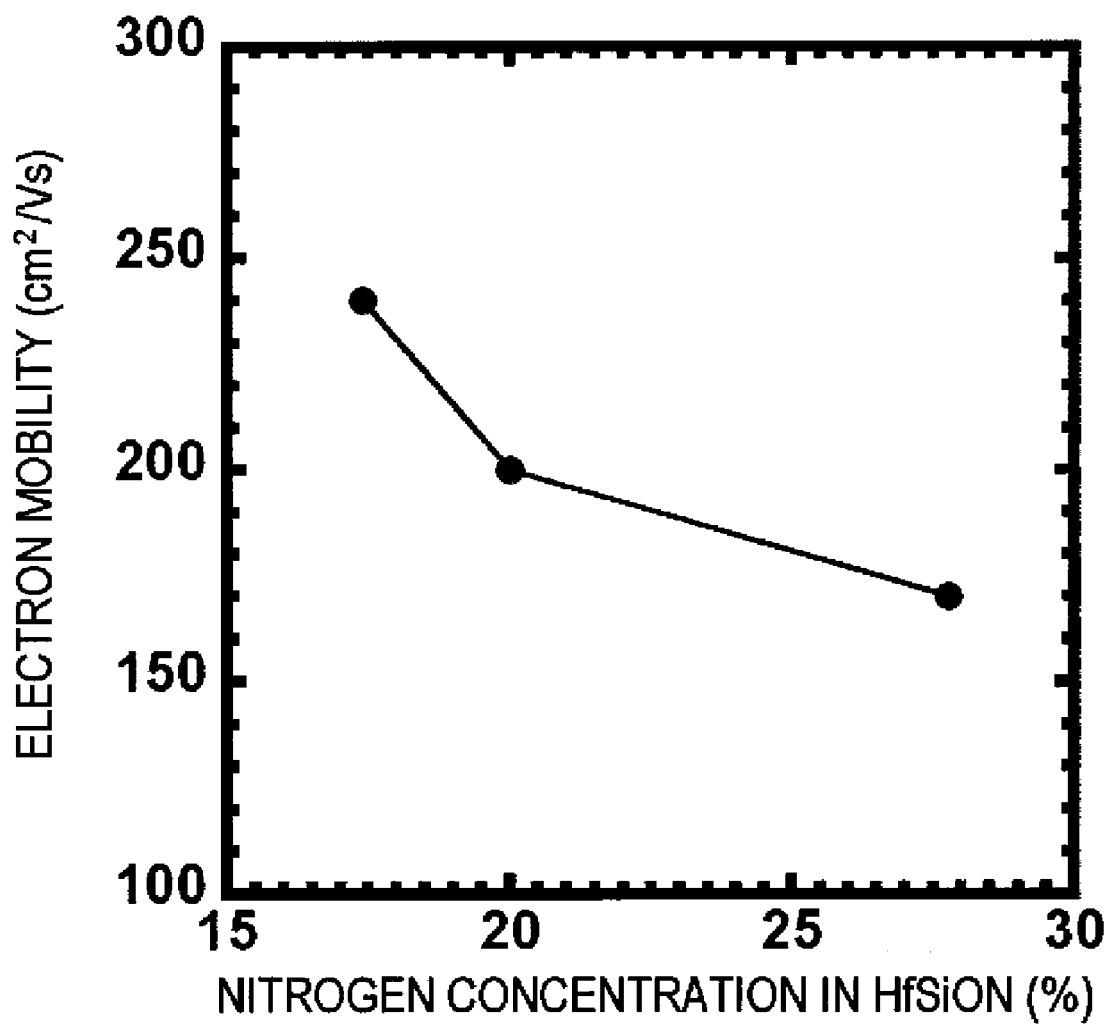
FIG. 11 is a drawing illustrating relations between nitrogen concentration in a high-k gate insulating film and carrier (electron) mobility, in an N-type transistor having no La contained at the interface between the high-k gate insulating film and an interfacial layer.

FIG. 11 is a drawing illustrating relations between the nitrogen concentration (atomic %) in the high-k gate insulating film 108 (108a) and carrier (electron) mobility, in the N-type transistor 162 having no La contained at the interface between the high-k gate insulating film 108 (108a) and the interfacial layer 107. It is known from the results shown in FIG. 11 that the carrier (electron) mobility decreases as the nitrogen concentration in the high-k gate insulating film 108 (108a) increases.

Figure 12:
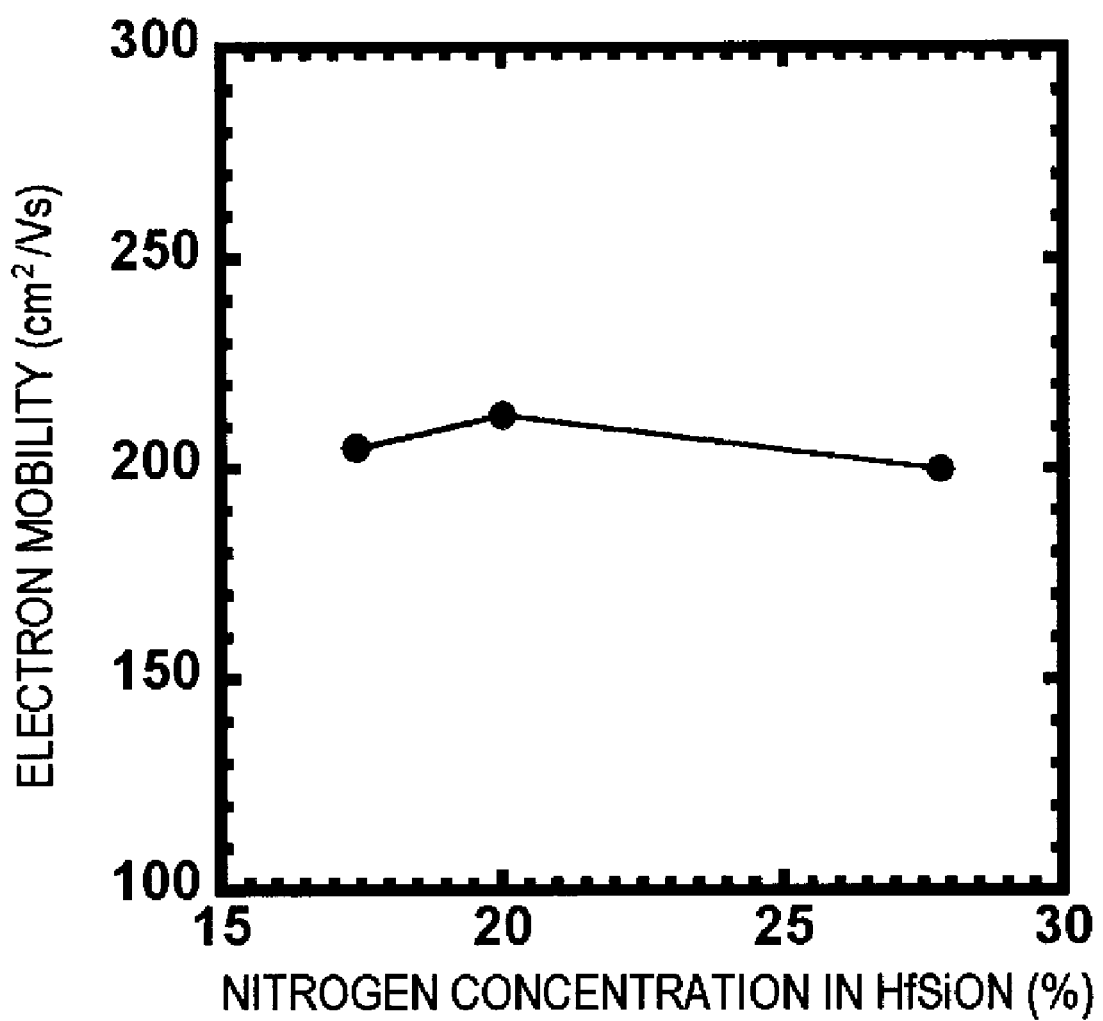
FIG. 12 is a drawing illustrating relations between nitrogen concentration in a high-k gate insulating film and carrier (electron) mobility, in an N-type transistor having La contained at the interface between the high-k gate insulating film and the interfacial layer.

On the other hand, FIG. 12 is a drawing illustrating relations between the nitrogen concentration (atomic %) in the high-k gate insulating film 108 (108a) and carrier (electron) mobility, in the N-type transistor 162 having La contained at the interface between the high-k gate insulating film 108 (108a) and the interfacial layer 107. It is known from the results shown in FIG. 12 that the carrier (electron) mobility remains almost unchanged even if the nitrogen concentration in the high-k gate insulating film 108 (108a) increases. The reason why is supposed as follows.

Figure 13:
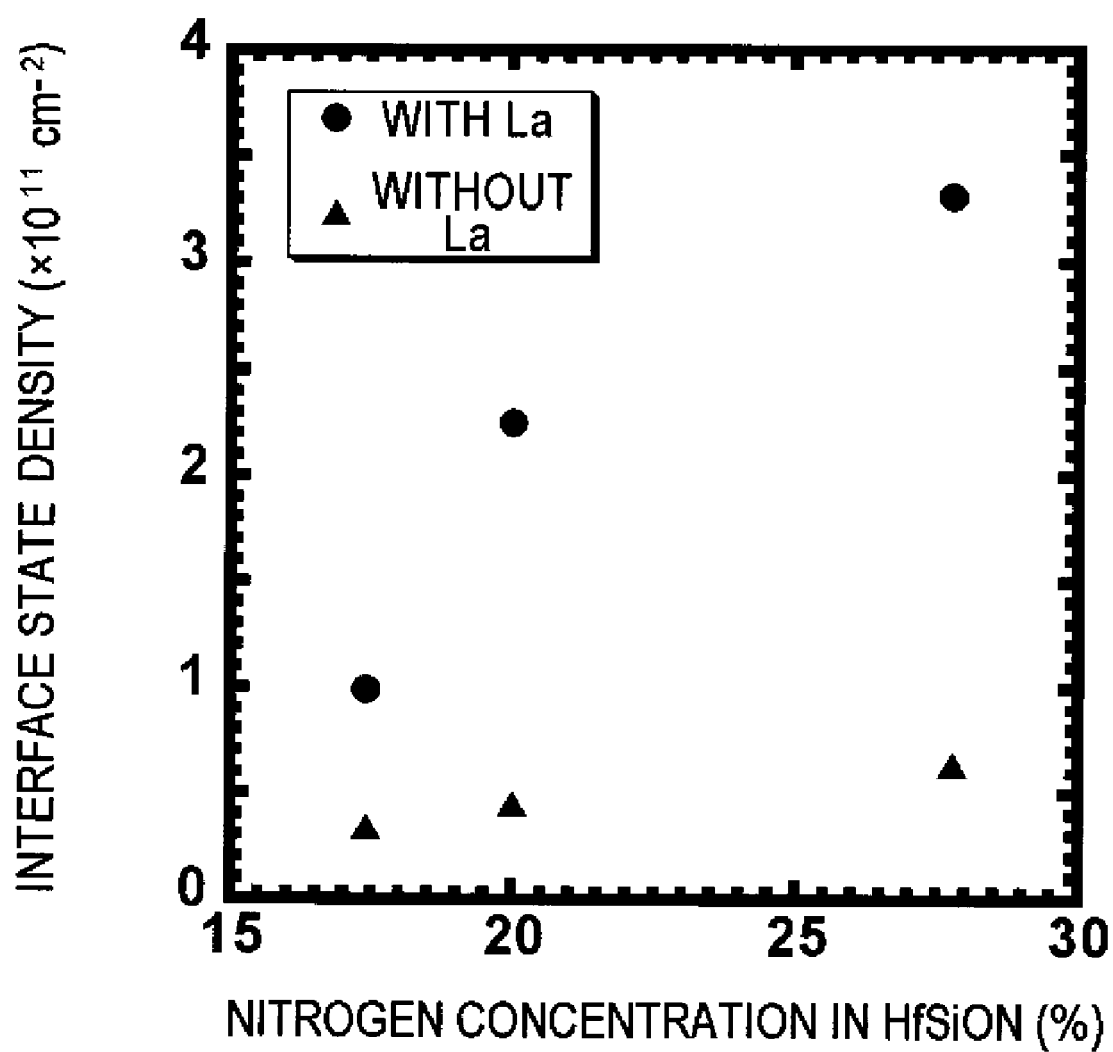
FIG. 13 is a drawing illustrating relations between nitrogen concentration in a high-k gate insulating film and interface state density, in the N-type transistors having La, and no La, contained at the interface between the high-k gate insulating film and an interfacial layer.

FIG. 13 is a drawing illustrating relations between nitrogen concentration (atomic %) in the high-k gate insulating film 108 (108a) and interface state density, in the N-type transistor 162 having La, and no La, contained at the interface between the high-k gate insulating film 108 (108a) and the interfacial layer 107.

It is found from the results shown in FIG. 13 that the interface state density increases as the nitrogen concentration in the high-k gate insulating film 108 (108a) increases, for the case where no La is contained at the interface between the high-k gate insulating film 108 (108a) and the interfacial layer 107. On the other hand, for the case where La is contained at the interface, the increase in interface state density is suppressed only to a slight degree. In other words, in the absence of La at the interface between the high-k gate insulating film 108 (108a) and the interfacial layer 107, nitrogen is supplied from the high-k gate insulating film 108 (108a) to the interfacial layer 107, and thereby the interface state density increases. On the other hand, in the presence of La at the interface between the high-k gate insulating film 108 (108a) and the interfacial layer 107, since La, which is an origin of the above-described dipole, contained at the interface between the high-k gate insulating film 108 (108a) and the interfacial layer 107 suppresses diffusion of nitrogen from the high-k gate insulating film 108 (108a) to the interfacial layer 107, so that increase in the interface state density may be suppressed.

Based on the findings described in the above, the nitrogen concentration in the high-k gate insulating film 108 (108a) of the N-type transistor 162 may typically be adjusted to 20% or above. By the adjustment, a high level of reliability of the N-type transistor 162 may be ensured. On the other hand, in view of ensuring desirable interfacial characteristics, the nitrogen concentration in the interfacial layer 107 may preferably be adjusted to 10% or below, for example. In the presence of La at the interface, diffusion of nitrogen from the high-k gate insulating film 108 (108a) to the interfacial layer 107 may be suppressed. Desirable interfacial characteristics can therefore be ensured, even if the nitrogen concentration in the high-k gate insulating film 108 (108a) might be elevated to a certain degree. However, as illustrated in FIG. 13, the interface state density slightly increases as the nitrogen concentration in the high-k gate insulating film 108 (108a) increases, even if La resides at the interface. For this reason, the nitrogen concentration in the high-k gate insulating film 108 (108a) of the N-type transistor 162 may be set to 28% or below, for example, by which the interface state density may be suppressed to $5 \times 10^{11}$ cm$^{-2}$ or below.

The embodiments of the present invention have been described referring to the attached drawings merely for exemplary purposes, while allowing adoption of various configurations other than those described in the above.

The above-described embodiment dealt with the case where the extension diffusion layers are formed after the source/drain diffusion layers are formed, and the side wall spacers are then removed. An alternative method may be such as forming the extension diffusion layers immediately after the offset spacers are formed, then forming the side wall spacers, and then forming the source/drain diffusion layers.

The present invention also includes the following features.
(1) A method of manufacturing a semiconductor device which contains a first-conductivity-type transistor and a second-conductivity-type transistor, the method comprising:
forming an interfacial layer composed of a silicon oxide film or a silicon oxynitride film, and a high-k gate insulating film containing Hf, in this order, over the entire surface of a substrate having a first channel region for forming the first-conductivity-type transistor and a second channel region for forming the second-conductivity-type transistor preliminarily formed therein;
depositing a first adjusting metal capable of varying the threshold voltage of the first-conductivity-type transistor, over the entire surface of the high-k gate insulating film;
forming a metal gate electrode over the entire surface of the first adjusting metal;
covering the first channel region with a protective film;
adding a diffusion suppressive element capable of suppressing diffusion of the first adjusting metal, into the high-k gate insulating film in the second channel region, using the protective film as a mask, while being mediated by the metal gate electrode; and
allowing, by annealing, the first adjusting metal to diffuse into the high-k gate insulating film in the first channel region, and to reach the interface between the high-k gate insulating film and the interfacial layer.
(2) In the method of manufacturing a semiconductor device, the metal gate electrode may be composed of TiN.
(3) In the method of manufacturing a semiconductor device, the diffusion suppressive element may be nitrogen.
(4) In the method of manufacturing a semiconductor device, the high-k gate insulating film may be composed of HfSiO or HfSiON.
(5) In the method of manufacturing a semiconductor device, the first conductivity type may be N-type, and the first adjusting metal may be any one of La, Y and Mg.
(6) In the method of manufacturing a semiconductor device, the first conductivity type may be P-type, and the first adjusting metal may be Al.

In the above method of manufacturing a semiconductor device, the forming the interfacial layer and the high-k gate insulating film in this order may further includes:
selectively forming a second adjusting metal capable of varying the threshold voltage of the second-conductivity-type transistor, over the interfacial layer in the second channel region, followed by formation of the high-k gate insulating film over the second adjusting metal.

In the above method of manufacturing a semiconductor device, the second adjusting metal may be La.
(7) In the method of manufacturing a semiconductor device, in the adding the diffusion suppressive element, the diffusion suppressive element may be added by plasma irradiation.
(8) In the method of manufacturing a semiconductor device, in the adding the diffusion suppressive element, the diffusion suppressive element may be added by ion implantation.

It is apparent that the present invention is not limited to the above embodiments, that may be modified and changed without departing from the scope and spirit of the invention.

What is claimed is:
1. A semiconductor device comprising:
a substrate;
a first-conductivity-type transistor having:
an interfacial layer composed of a silicon oxide film or a silicon oxynitride film formed over said substrate;
a high-k gate insulating film containing Hf and formed over said interfacial layer; and
a metal gate electrode formed over said high-k gate insulating film, and
a second-conductivity-type transistor having:
- an interfacial layer composed of a silicon oxide film or a silicon oxynitride film formed over said substrate;
- a high-k gate insulating film containing Hf and formed over said interfacial layer; and
- a metal gate electrode formed over said gate insulating film;

a first adjusting metal for varying the threshold voltage of said first-conductivity-type transistor residing at the interface between said interfacial layer and said high-k gate insulating film, at least in said first-conductivity-type transistor, a diffusion suppressive element capable of suppressing diffusion of said first adjusting metal residing in said high-k gate insulating film, at least in said second-conductivity-type transistor, and the concentration of said diffusion suppressive element in said high-k gate insulating film of said second-conductivity-type transistor is higher than the concentration of said diffusion suppressive element in said high-k gate insulating film of said first-conductivity-type transistor.

2. The semiconductor device as claimed in claim 1, wherein said first adjusting metal resides between said high-k gate insulating film and said metal gate electrode in said second-conductivity-type transistor.

3. The semiconductor device as claimed in claim 1, wherein said first adjusting metal also resides between said high-k gate insulating film and said metal gate electrode in said first-conductivity-type transistor.

4. The semiconductor device as claimed in claim 1, wherein said metal gate electrode is composed of TiN.

5. The semiconductor device as claimed in claim 1, wherein said diffusion suppressive element is nitrogen.

6. The semiconductor device as claimed in claim 1, wherein said high-k gate insulating film is composed of HfSiO or HfSiON.

7. The semiconductor device as claimed in claim 1, wherein said first conductivity type is N-type, and said first adjusting metal is any one of La, Y and Mg.

8. The semiconductor device as claimed in claim 1, wherein said first conductivity type is N-type, and said first adjusting metal is an element capable of suppressing nitrogen from diffusing into said interfacial layer.

9. The semiconductor device as claimed in claim 1, wherein said first adjusting metal is La.

10. The semiconductor device as claimed in claim 1, wherein said first conductivity type is P-type, and said first adjusting metal is Al.

11. The semiconductor device as claimed in claim 10, wherein said second conductivity type is N-type, and in said second-conductivity-type transistor, a second adjusting metal capable of varying the threshold voltage of said second-conductivity-type transistor resides at the interface between said interfacial layer and said high-k gate insulating film.

12. The semiconductor device as claimed in claim 11, wherein said second adjusting metal is an element capable of suppressing nitrogen from diffusing into said interfacial layer.

13. The semiconductor device as claimed in claim 11, wherein said second adjusting metal is La.

14. The semiconductor device as claimed in claim 1, wherein, in an N-type transistor composed of either said first-conductivity-type transistor or said second-conductivity-type transistor, said high-k gate insulating film contains said diffusion suppressive element, and the concentration of said diffusion suppressive element in said interfacial layer is lower than the concentration of said diffusion suppressive element in said high-k gate insulating film.

15. The semiconductor device as claimed in claim 1, wherein, in an N-type transistor composed of either said first-conductivity-type transistor or said second-conductivity-type transistor, said high-k gate insulating film contains said diffusion suppressive element, and the concentration of said diffusion suppressive element is 20% or higher.

16. The semiconductor device as claimed in claim 1, wherein said diffusion suppressive element resides in said high-k gate insulating film, also in said first-conductivity-type transistor.

17. The semiconductor device as claimed in claim 1, wherein said first conductivity type is N-type, and in said first conductivity type transistor, said high-k gate insulating film contains said diffusion suppressive element, and the concentration of said diffusion suppressive element in said interfacial layer is lower than the concentration of said diffusion suppressive element in said high-k gate insulating film.

18. The semiconductor device as claimed in claim 1, wherein said first conductivity type is N-type, and in said first conductivity type transistor, said high-k gate insulating film contains said diffusion suppressive element, and the concentration of said diffusion suppressive element is 20% or higher in said high-k gate insulating film.

* * * * *